(12) United States Patent
Aitken et al.

(10) Patent No.: US 6,380,780 B1
(45) Date of Patent: Apr. 30, 2002

(54) INTEGRATED CIRCUIT WITH SCAN FLIP-FLOP

(75) Inventors: Robert C. Aitken, San Jose; Haluk Konuk, Mountain View, both of CA (US); Jeff Rearick, Fort Collins, CO (US); John Stephen Walther, Sunnyvale, CA (US)

(73) Assignee: Agilent Technologies, Inc, Palo Alto, CA (US)

( * ) Notice: Subject to any disclaimer, the term of this patent is extended or adjusted under 35 U.S.C. 154(b) by 0 days.

(21) Appl. No.: 09/585,366

(22) Filed: Jun. 1, 2000

(51) Int. Cl.[7] ............................................. H03K 3/356
(52) U.S. Cl. ...................................... 327/202; 327/203
(58) Field of Search ................................ 327/202, 203, 327/208, 209, 210, 211, 212, 218; 714/726, 729

(56) References Cited

U.S. PATENT DOCUMENTS 5,938,782 A * 8/1999 Kay ........................... 714/726
6,020,772 A * 2/2000 Hayashi et al. ............. 327/202

FOREIGN PATENT DOCUMENTS

| JP | 3-218483 | * | 9/1991 |
| JP | 6-118138 | * | 4/1994 |

* cited by examiner

Primary Examiner—Tuan T. Lam

(57) ABSTRACT

An integrated circuit is provided with Fully Automated Scan Testing (FAST)-lite flip-flop. The integrated circuit has data, scan in, master-hold, clock, scan-into-master, and master-to-scan-out inputs. A first transistor circuit is connected to the data, master-hold, and clock inputs and has a first transistor circuit output. A second transistor circuit is connected to the can in and scan-into-master inputs and has a second transistor circuit output. A first flip-flop is connected to the first transistor circuit and second transistor circuit outputs and has a first flip-flop output. A third transistor circuit is connected to the second transistor circuit output and the master-to-scan-out input and has a third transistor circuit output. A second flip-flop latch is connected to the third transistor circuit output has a second flip-flop output. The FAST-lite flip-flop uses the normal functionality of the first flip-flop and second flip-flop to operate either in a normal mode or a test mode for scan testing. The FAST-lite flip-flop is so designated because it uses one less flip-flop than the prior art FAST flip-flop.

19 Claims, 7 Drawing Sheets

INTEGRATED CIRCUIT WITH SCAN FLIP-FLOP

TECHNICAL FIELD

The present invention relates generally to fully automated scan testing flip-flops and more particularly to less complex fully automated scan testing flip-flops.

BACKGROUND ART

Application Specific Integrated Circuits (ASICS) can be programmed to perform any number of functions. In order to test them efficiently, it is important to include testability feature on the circuits that are independent of any potential programming. In this way, the same approach can be used to test a chip regardless of its eventual application. As a result, a design-for-testing (DFT) approach is commonly used in development of hardware components. Scan testing is a result of this approach. It provides for the control and observation of all state elements inside the design of an integrated circuit.

In order to implement scan testing, every flip-flop in a design must have an access method. The standard approach is to design a flip-flop that has a multiplexer at its main input and a control signal to switch between a test mode and a normal mode. In the normal mode the circuit operates as designed. In the test mode, the simplest case results in all of the flip-flops acting as one large shift register. This allows the insertion of test values into the circuit one at a time. At each clock step a bit is moved further along into the shift register chain. Eventually, the entire circuit is loaded with test values, and then the shift register unloaded at one end while new test values are loaded in at the other.

The multiplexed flip-flop approach has several inherent problems, the most important of which is its use of at least two different clocking schemes for the normal and test modes of operation. Because the timing in a high-speed circuit must be accurate to fractions of a nanosecond in order for the multiplexed flip-flop approach to work correctly, it is common for skew or overlap between clocks to cause data to jump across two flip-flops instead of the next one. This phenomenon, called shoot-through, causes the flip-flops to update in the wrong order and can invalidate the testing cycle.

Another problem occurs when attempting to verify that the circuit can operate at its required frequency, a process known as at-speed testing. Using a multiplexed flip-flop, the chip would be put into scan mode to load in all the values, switched to normal mode to operate for one cycle, then returned to scan mode in order to observe the results. This require that the multiplexer control signal change almost instantaneously across wide portion of a chip. Because it is very difficult to coordinate the clocking, control, and protocol signals to such fine precision, a different implementation for scan testing was sought. Software support for the multiplexed flip-flop was insufficient to overcome its shortcomings, so a hardware solution was developed, taking the form of a Fully Automated Scan Testing, or FAST, flip-flop.

The FAST flip-flop was designed specifically to alleviate the various timing problems of the multiplexed flip-flop. It had three advantages over the multiplexed flip-flop. The first was its utilization of two special, non-overlapping shift clocks, making the normal system clock unnecessary for shifting. Because the clocks were non-overlapping, skew was no longer problem and shoot-through could not occur. The clocks could vary significantly from one flip-flop to the next and still operate reliably. The second advantage was that the FAST flip-flop was capable of the at-speed testing without the difficulties associated with multiplexed flip-flops. Finally, FAST flip-flops supported a technique called partial scan, where some of the flip-flops were on the scan chain and others were not, so sections of the circuit could be scanned.

Although the FAST flip-flop had these significant advantages over the multiplexed flip-flop, it had several drawbacks. Its design took up about 75% more space on an integrated circuit chip because the additional testing circuitry in the FAST methodology required three latches instead of the two required for the multiplexed approach. It required the circuitry and routing space for three input signals instead of one. Also, due to the work inherent in the partial can technique, more time was required to create tests. When use of the partial scan technique was deemed unjustified a few years after the FAST flip-flop's invention due to the inordinate amount of time required in the design process, a considerable portion of the FAST flip-flop's chip area was being devoted to an unused feature.

DISCLOSURE OF THE INVENTION

The present invention provides an integrated circuit with a Fully Automated Scan Testing (FAST)-lite flip-flop. The integrated circuit has data, scan in, master-hold, clock, scan-into-master and master-to-scan-out inputs. A first transistor circuit is connected to the data, master-hold, and clock inputs and has a first output. A second transistor circuit is connected to the scan in and scan-into-master inputs and has a second output. A master latch is connected to the first and second outputs and has a master latch output. A third transistor circuit is connected to the second output and the master-to-scan-out and clock inputs and has a third output. A single slave latch is connected to the third switching circuit output and has a slave latch output. The FAST-lite flip-flop uses normal functionality master and slave latches to operate either in a normal mode or a test mode for scan testing. The FAST-lite flip-flop is so designated because it uses one less latch than the prior art and thus reduces the chip area require for its placement by about 20% over the original FAST design. This reduction in chip area also allows for faster normal operation of the integrated circuit as well as a decrease in testing time.

The present invention further provides an integrated circuit with a FAST-lite and/or FAST-lean flip-flops which make the integrated circuit design independent from the integrated circuit testing. The FAST-lite and/or FAST-lean flip-flops have the scan in input and scan out output ports separate from the normal data input port.

The present invention further provides an alternate embodiment with a FAST-lean flip-flop. The integrated circuit is similar to the FAST-lite, but merges the master-to-scan-out and clock inputs into a single merged signal which serves as a control for the slave latch. The FAST-lean flip-flop is so designated because it eliminates one input signal and its associated ports, circuitry, and wiring and so reduces the area and the routing congestion over the FAST-lite flip-flop.

The present invention further provides that the FAST, FAST-lite, and FAST-lean flip-flops are mutually compatible and may be incorporated in the same integrated circuit where old and new modules are mixed.

The present invention further provides an integrated circuit with a FAST-lite and/or FAST-lean flip-flops which have built-in testability.

The present invention further provides an integrated circuit with a FAST-lite and/or FAST-lean flip-flops which merge clocking schemes.

The present invention further provides an integrated circuit with a FAST-lite and/or FAST-lean flip-flops which scan into a slave latch.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
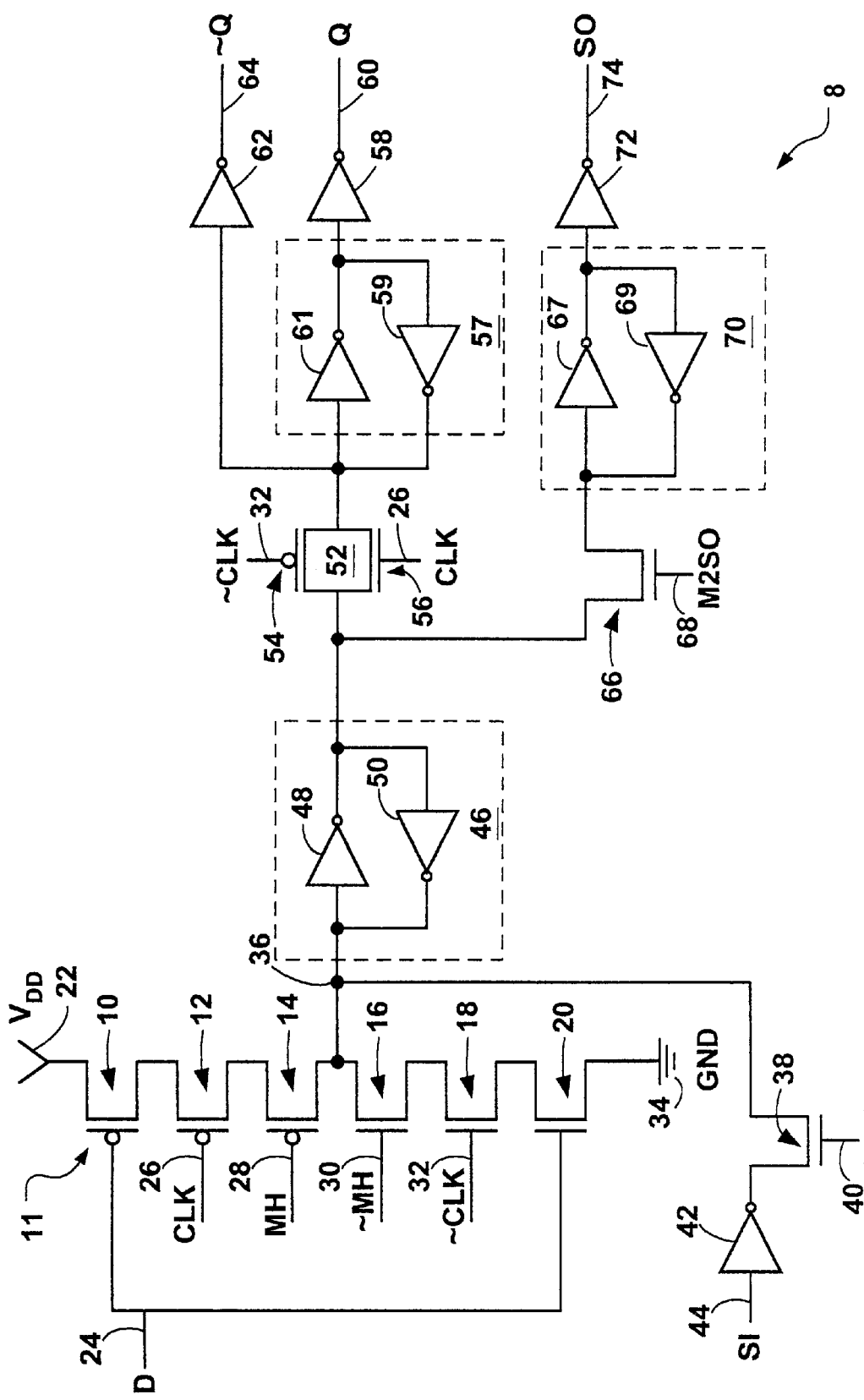
FIG. 1 (PRIOR ART) is a functional-level schematic of a FAST flip-flop.

Organization:

Referring now to FIG. 1 (PRIOR ART), therein is shown the present invention, referred to as a FAST flip-flop 8, made up of a number of transistor circuits and two latches. A clocked inverter circuit 11 consists of three series PMOS transistors 10, 12, and 14 connected to three series NMOS transistors 16, 18, and 20. The source of the PMOS transistor 10 is connected to the power supply $V_{DD}$ 22. The gate of the PMOS transistor 10 is connected to a data (D) input 24. The gate of the PMOS transistor 12 is connected to a system clock (CLK) 26. The gate of the PMOS transistor 14 is connected to a master-hold (MH) input 28. The gate of the NMOS transistor 16 is connected to the inverse of the MH input signal, or ~MH input 30. As well known to those skilled in the art, the inverse signals are produced by inverters, which are not shown in order to simplify the explanation.

The gate of the NMOS transistor 18 is connected to the inverse of the system clock, or ~CLK 2. The gate to the NMOS transistor 20 is connected to the D input 24. The drain of the NMOS transistor 20 is connected to a common ground 34.

A node 36 connects the two series transistor circuits and is also connected to the drain of an NMOS transistor 38. The gate of the NMOS transistor 38 is connected to a scan-into-master SI2M) input 40. The source of the NMOS transistor 38 is connected to the output of an inverter 42. The input to the inverter 42 is connected to a scan in (SI) port 44.

The connecting node 36 acts as an input to a master latch 46. The master latch 46 has two inverters 48 and 50. The input of the inverter 50 is connected to the output of the inverter 48 and the output of the inverter 48 is connected to the input of the inverter 50. The output of the master latch 46 leads to the input of a pass gate 52. The pass gate 52 is a PMOS transistor 54 with its drain and source connected to the drain and source of a NMOS transistor 56. The input to the PMOS transistor 54 is connected to the ~CLK input 32. The input to the NMOS transistor 56 is connected to the CLK 26. The pass gate 52 is connected to a slave latch 5.

The slave latch 57 is constructed identically to the master latch 46 with parallel inverters 59 and 61 having inputs connected to outputs, and outputs connected to inputs. The output of the slave latch 57 is connected to an inverter 58. The output of the inverter 58 is a bistable output signal Q 60. The pass gate 52 is also connected to an inverter 62. The inverter 62 produces an inverted output ~Q signal 64.

The output of the master latch 46 is also connected to the source of an NMOS transistor 66. The NMOS transistor 66 is connected to a master-to-scan-out (M2SO) input 68. The drain of the NMOS transistor 66 is connected to input of a system out (SO) slave latch 70. The SO slave latch 70 is constructed in a fashion identical to that of the master latch 46 and slave latch 57 by using two inverters 67 and 69. The output of the SO slave latch 70 is connected to an inverter 72. The output of the inverter 72 is a SO output 74.

Figure 2:
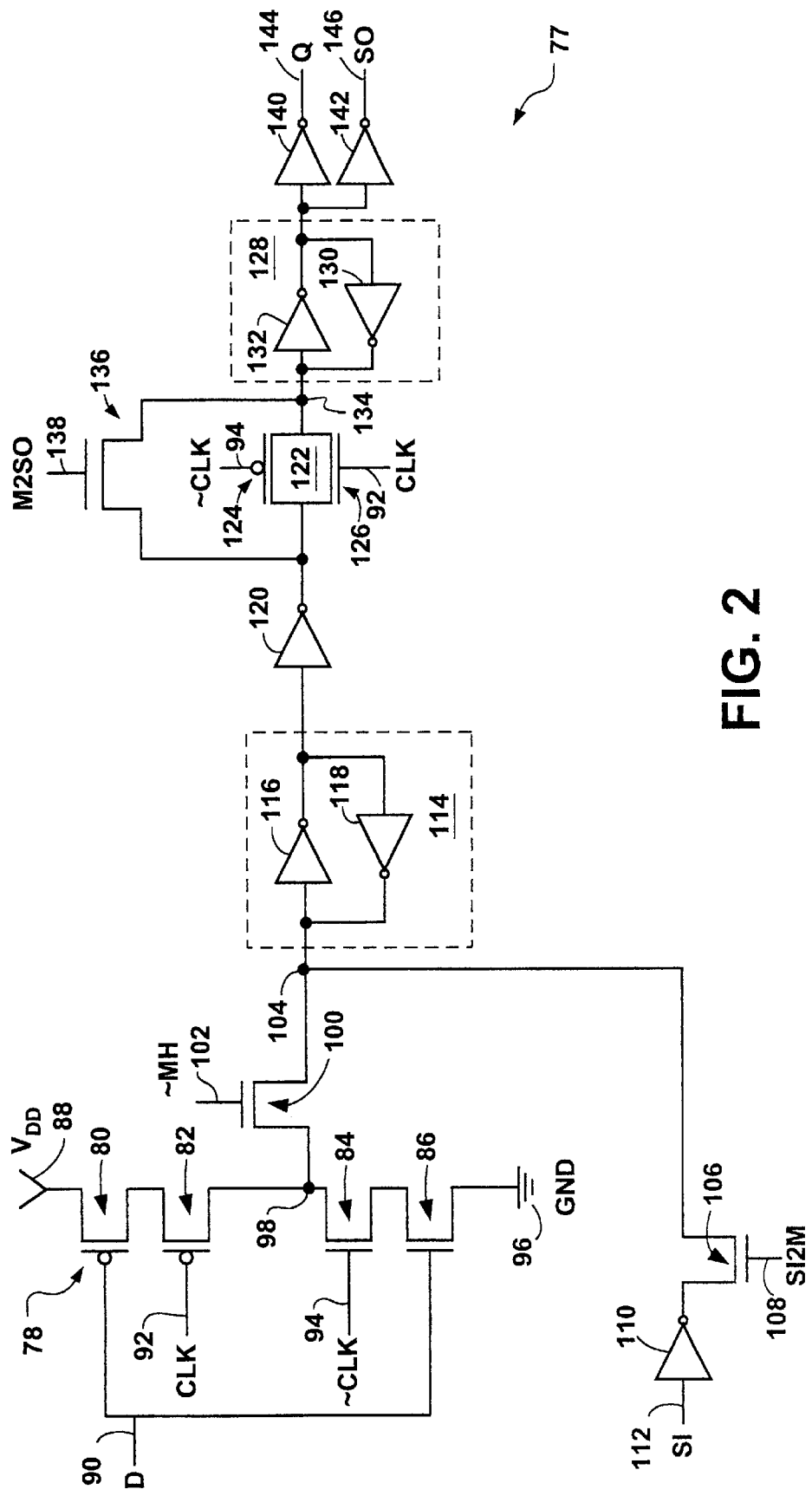
FIG. 2 is an exemplary functional-level schematic of a FAST-lite flip-flop of the present invention.

Referring now to FIG. 2, therein is shown a functional diagram of the present invention, a FAST-lite flip-flop 77. The same nomenclature is used hereafter as used in FIG. 1 (PRIOR ART). A clocked inverter circuit 78 consisting of two series PMOS transistors 80 and 82 is connected to two series NMOS transistors 84 and 86. The source of the PMOS transistor 80 is connected to a power supply $V_{DD}$ 88. The gate of the PMOS transistor 80 is connected to a D input 90. The gate of the PMOS transistor 82 is connected to a system clock, CLK 92. The gate of the NMOS transistor 84 is connected to the inverse of the system clock, ~CLK 94. The gate to the NMOS transistor 86 is connected to the D input 90. The drain of the NMOS transistor 86 is connected to a common ground 96. A node 98 connects the two series transistor circuits and is also connected to the source of an NMOS transistor 100. The gate of the NMOS transistor 100 is connected to a MH input 102. The drain of the NMOS transistor 100 is connected to a node 104.

The node 104 is connected to the drain of an NMOS transistor 106. The gate of the NMOS transistor 106 is connected to a SI2M input 108. The source of the NMOS transistor 106 is connected to the output of an inverter 110, which is further connected to an SI, input 112.

The node 104 is connected to the inverters that create a master latch 114, which is one of the two latches of the present invention. The master latch 114 is made up of two inverters 116 and 118. The output of the inverter 116 is connected to the input of the inverter 118 and the output of the inverter 118 is connected to the input of the inverter 116. The output of the master latch 114 is connected to the input of an inverter 120.

The output of the inverter 120 is connected to a pass gate 122. The pass gate 122 is constructed from a PMOS transistor 124 with its drain and source connected to the drain and source of a NMOS transistor 126. The input to the PMOS transistor 124 is connected to the ~CLK 94. The input to the NMOS transistor 126 is connected to the CLK 92. The output of the pass gate 122 is connected to a node 134. The node 134 is connected to the input of a slave latch 128, which is the second latch of the present invention. The slave latch 128 is made up of two inverters 130 and 132. The output of the inverter 130 is connected to the input of the inverter 132. The output of the inverter 132 is connected to the input of the inverter 130.

The output of the inverter 120 is also connected to the source of an NMOS transistor 136 The gate of the NMOS transistor 136 is connected to a M2SO input 138. The drain of the NMOS transistor 136 is connected to the node 134. The node 134 is also connected to the input of two inverters 140 and 142. The output of the inverter 140 is an output Q 144 signal. The output of the inverter 142 is an output SO signal 146.

Figure 3:
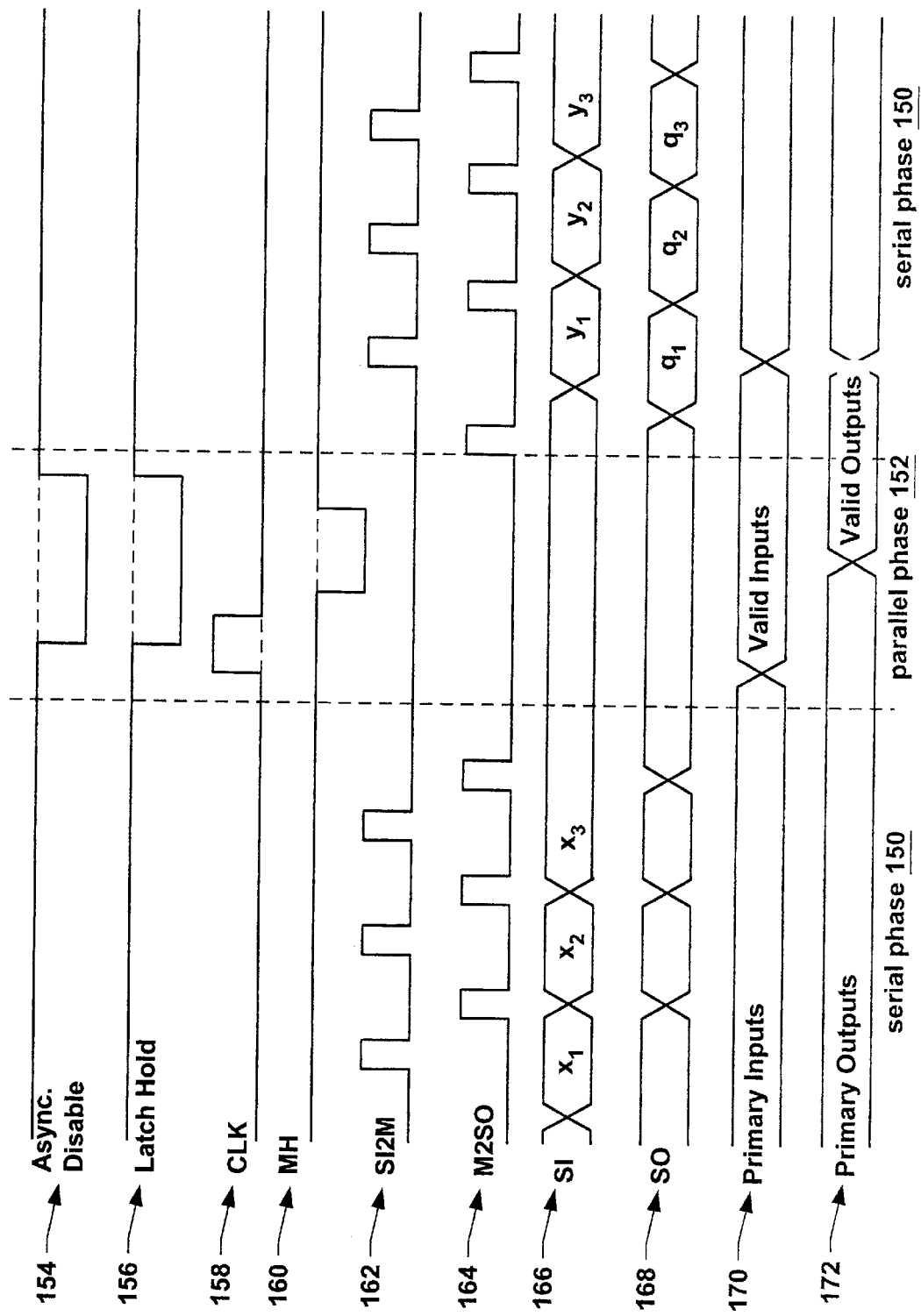
FIG. 3 is an exemplary timing diagram of a static scan test protocol for a FAST-lite flip-flop of the present invention.

Referring now to FIG. 3, therein is shown a timing diagram of a static scan test protocol for the FAST-lite flip-flop 77 of FIG. 2. The diagram is split into a serial phase 150 an a parallel phase 152. The serial phase 150 is repeated to show the sequential nature of the operation. The input signals shown on the vertical axis of the graph are: the asynchronous disable 154, a latch hold 156, a CLK 158, a MH 160, a SI2M 162, a M2SO 164, a SI 166, a SO 168, primary system inputs 170, and primary system outputs 172.

Figure 4:
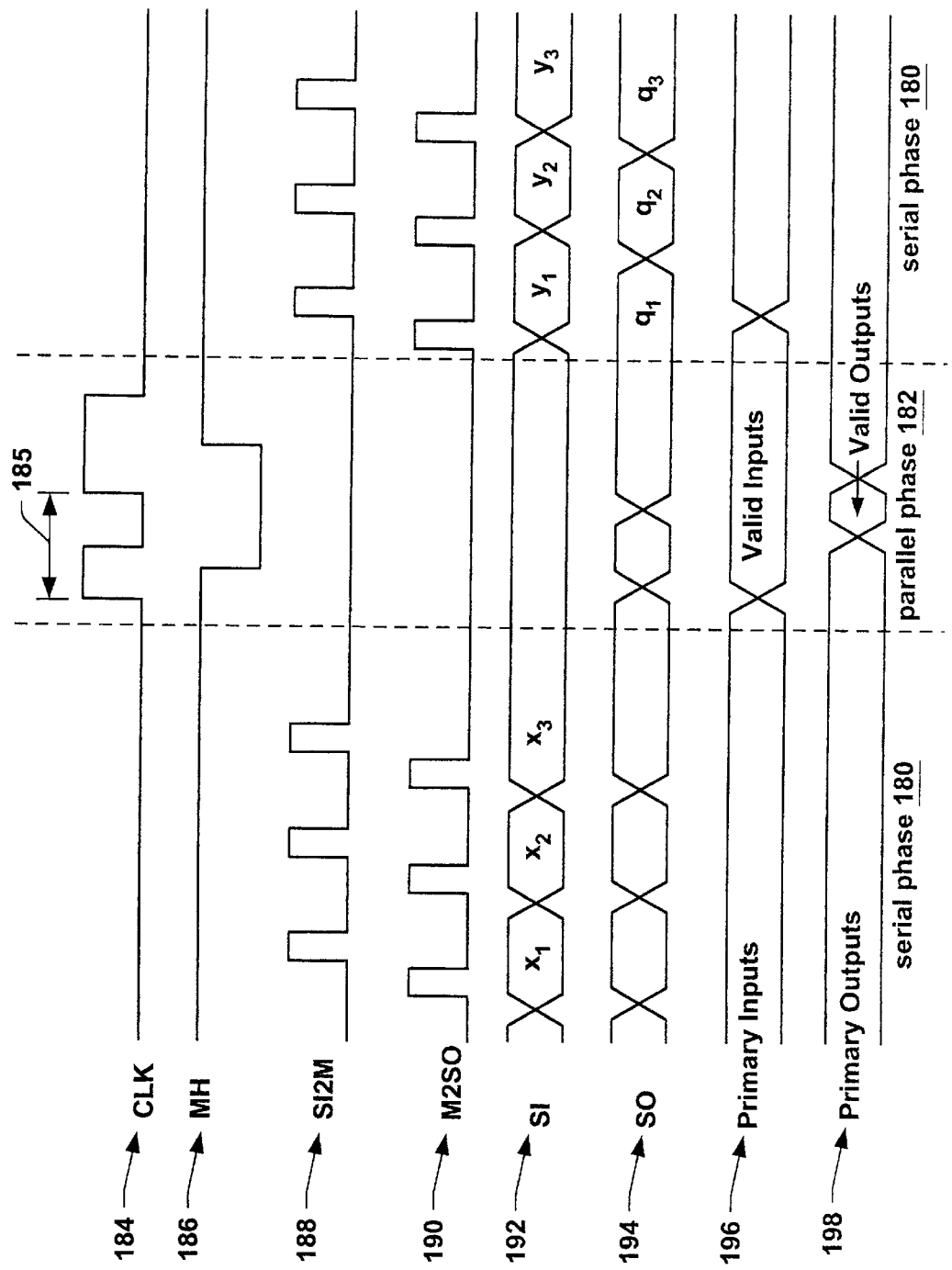
FIG. 4 is an exemplary timing diagram of a stuck-at-speed scan test protocol for a FAST-lean flip-flop of the present invention.

Referring now to FIG. 4, therein is shown a timing diagram of a Stuck-at-speed scan test protocol for the FAST-lite flip-flop 77. The diagram is similar in structure to that of FIG. 3 and is split into a serial phase 180 and a parallel phase 182. The serial phase 180 is repeated to show the sequential nature of the operation. The input signals shown on the vertical axis of the graph are: a CLK 184, a MH 186, a SI2M 188, a M2SO 190, a SI 192, a SO 194, primary system inputs 196, and primary system outputs 198.

Figure 5:
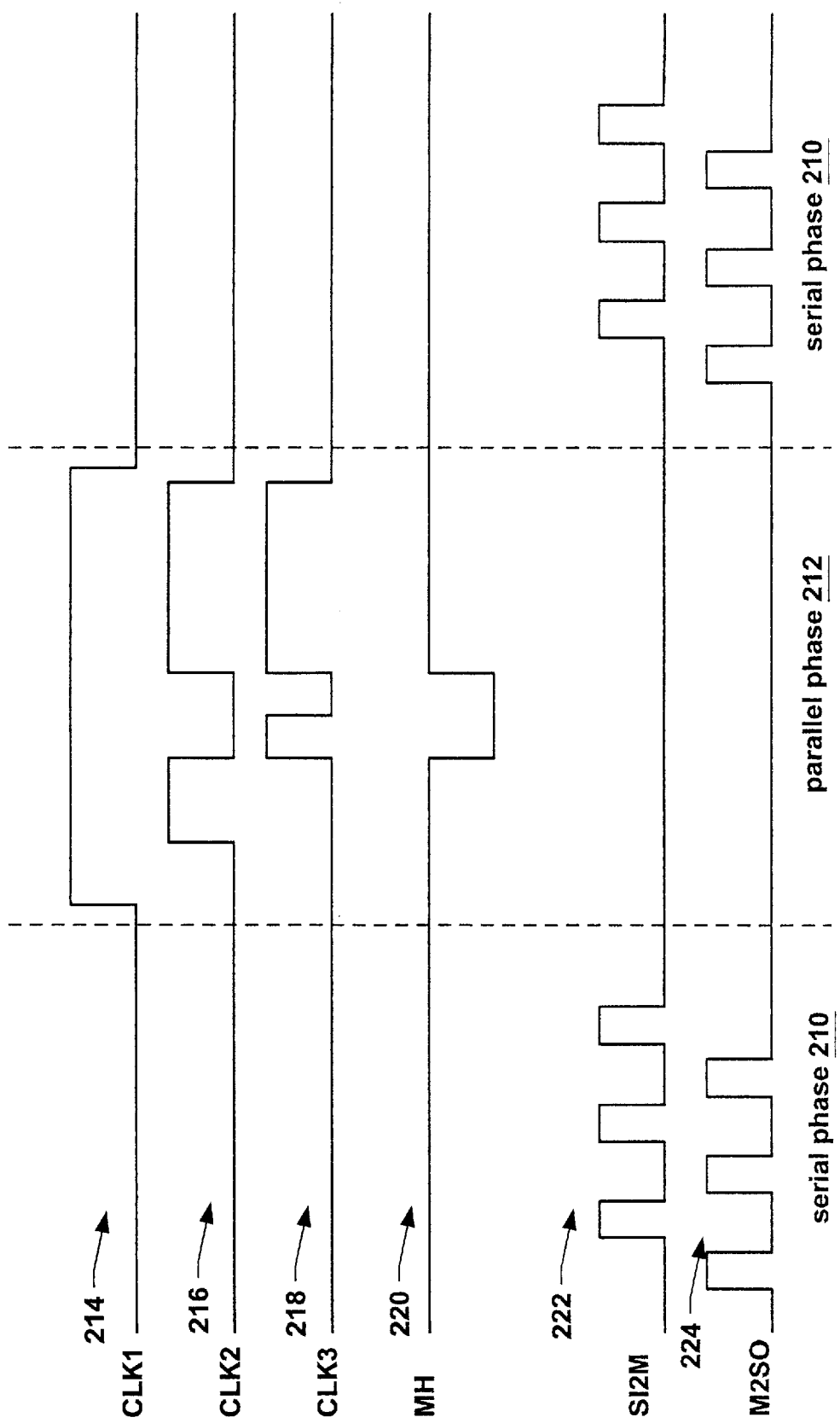
FIG. 5 is a timing diagram that depicts the relationship between the clocks and the input signals.

Referring now to FIG. 5, therein is shown a timing diagram that depicts the relationship between the clocks and the input signals. The diagram is similar in structure to that of FIG. 3 and FIG. 4 in that it is split into a serial phase 210, and a parallel phase 212. The serial phase 210 is repeated to show the sequential nature of the operation. The input signals shown on the vertical axis of the graph include three clocks, CLK1 214, CLK2 216, and CLK3 218, a MH 220, a SI2M 222, and a M2SO 224.

Figure 6:
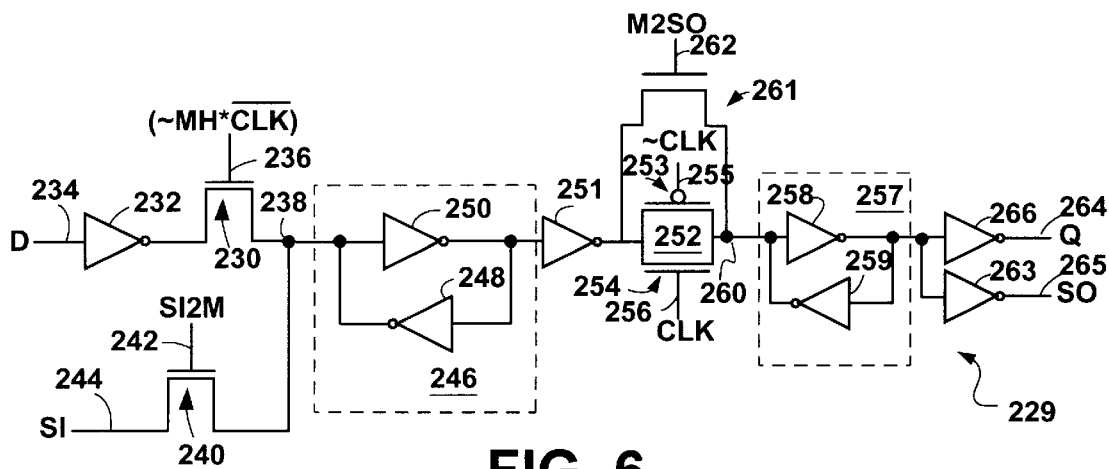
FIG. 6 is an alternate mode of the present invention which forms a control signal for a master latch.

Referring now to FIG. 6, therein is shown an alternate mode of the present invention, a FAST-lite flip-flop 229 which combines the ~MH and ~CLK inputs into a control of a master latch. A D input 234 is connected to the input of an inverter 232. The output of the inverter 232 acts as the source of an NMOS transistor 230. The gate of the NMOS transistor 230 is connected to an input signal representing the logical AND function (~MH*~CLK) 236. The drain of the NMOS transistor 230 is connected to a node 238. The node 238 is also connected to the drain of a different NMOS transistor 240. The gate of the NMOS transistor 240 is connected to a SI2M input 242. The source of the NMOS transistor 240 is connected to a SI input 244.

The node 238 is also connected to the components that make up a master latch 246. The master latch 246 is made up of two inverters 248 and 250. They are configured so the output of the inverter 248 is connected to the input of the inverter 250 and the output of the inverter 250 is connected to the input of the inverter 248. The output of the master latch 246 is connected to the input of an inverter 251.

The output of the inverter 251 is connected to a pass gate 252. The pass gate 252 is constructed from a PMOS transistor 253 with its drain and source connected to the drain and source of a NMOS transistor 254. The input to the PMOS transistor 253 is connected to a ~CLK input 255. The input to the NMOS transistor 254 is connected to a CLK input 256. The output of the pass gate 252 is connected to the node 260. The node 260 is connected to the input of a slave latch 257, which is the second latch of the present invention. The slave latch 257 is made up of two inverters 258 and 259.

The output of the inverter 258 is connected to the input of the inverter 259. The output of the inverter 259 is connected to the input of the inverter 258.

The output of the inverter 251 is also connected to the source of an NMOS transistor 261. The gate of the NMOS transistor 261 is connected to a M2SO input 262. The drain of the NMOS transistor 261 is connected to a node 260. The node 260 is also connected to the input of two inverters 263 and 266. The output of the inverter 266 is an output Q signal 264. The output of the inverter 263 is an output SO signal 265.

Figure 7:
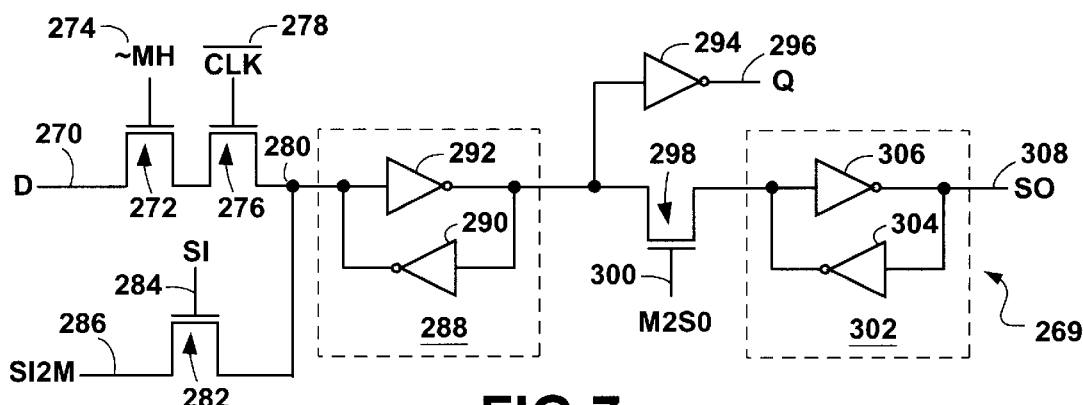
FIG. 7 is an alternate mode of the present invention featuring a scanable latch.

Referring now to FIG. 7, therein is shown an extension 269 of the FAST-lite flip-flop 77 featuring a scanable latch. A D input 270 is connected to the source of an NMOS transistor 272. The gate of the NMOS transistor 272 is connected to a MH input 274. The drain of the NMOS transistor 272 is connected to the source of an NMOS transistor 276. The gate of the NMOS transistor 276 is connected to a CLK 278. The drain of the NMOS transistor 276 is connected to a node 280. The node 280 is also connected to the output of an NMOS transistor 282. The gate of the NMOS transistor 282 is connected to a SI input 284. The source of the NMOS transistor 282 is connected to a SI2M input 286.

The node 280 is also connected to a master latch 288. The master latch 288 is made up 0 two inverters 290 and 292. They are configured so the output of the inverter 290 is connected to the input of the inverter 292 and the output of the inverter 292 is connected to the put of the inverter 290. The output of the master latch 288 is connected to the input of an inverter 294. The output of the inverter 294 is a Q output 296. The output of the master latch 288 is also connected to the source of an NMOS transistor 298. The gate of the NMOS transistor 298 is connected to a M2SO control signal 300. The drain of the NMOS transistor 298 is connected to a slave latch 302. The slave latch 302 is made up of two inverters 304 and 306. The are configured so the output of the inverter 304 is connected to the input of the inverter 306 and the output of the inverter 306 is connected to the input of the inverter 304. The output of the slave latch 302 is a SO output 308.

Figure 8:
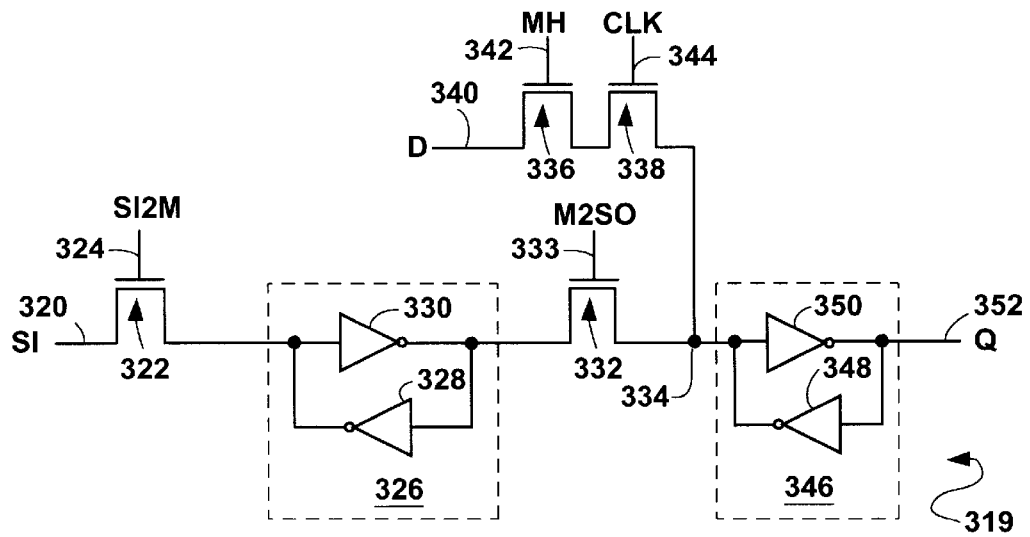
FIG. 8 is an alternate mode of the present invention featuring a scanable latch with inverted clocking.

Referring now to FIG. 8, therein is shown an extension 319 of the FAST-lite flip-flop 77 which scans into the slave latch 128, shown in FIG. 2. An SI input signal 320 is connected to the source of an NMOS transistor 322. The gate of the NMOS transistor 322 is connected to a SI2M input 324. The drain of the NMOS transistor 322 is connected to a master latch 326. The master latch 326 is made up of two inverters 328 and 330. They are configured so the output of the inverter 328 is connected to the input of the inverter 330 and the output of the inverter 330 is connected to the input of the inverter 328. The output of the master latch 326 is connected to the source of an NMOS transistor 332. The gate of the NMOS transistor 332 is connected to a M2SO signal 333. The source of the NMOS transistor 332 is connected to a node 334. Connected to the node 334 are two series NMOS transistors 336 and 338. The source of the first NMOS transistor is connected to a D input 340. The gate of the first NMOS transistor 336 is connected to a MH input 342. The gate of the second NMOS transistor 338 is connected to a CLK 344.

The node 334 is also connected to a slave latch 346. The slave latch 346 is made up of two inverters 348 and 350. They are configured so that the output of the inverter 348 is connected to the input of the inverter 350 and the output of the inverter 350 is connected to the input of the inverter 348. The output of the slave latch 346 is a Q output 352.

Figure 9:
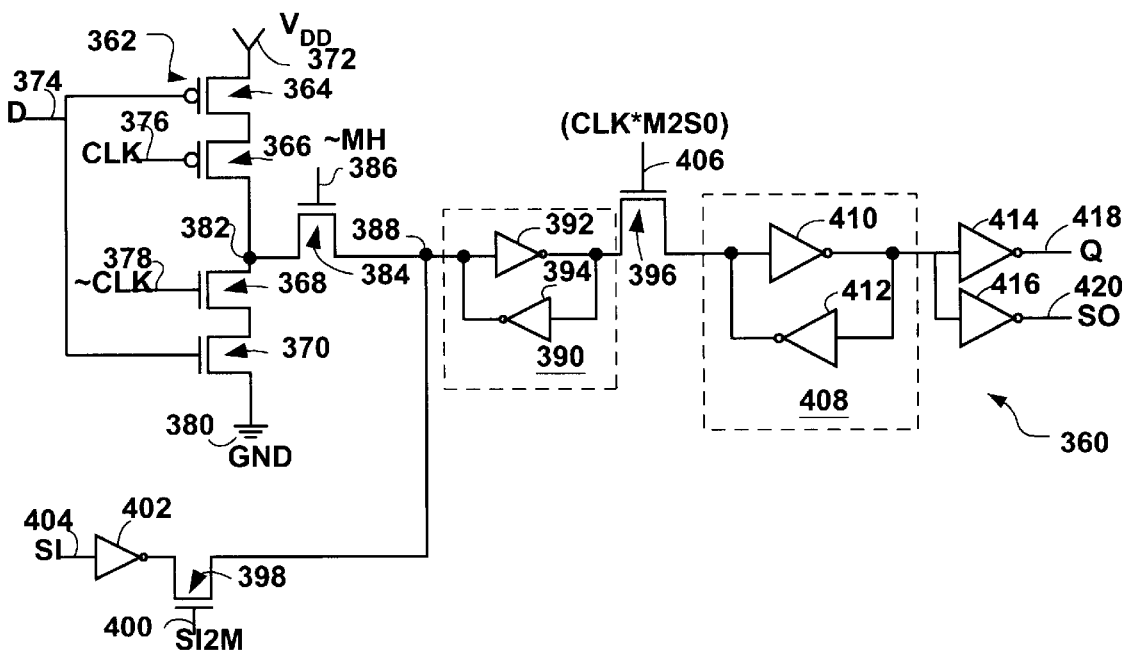
FIG. 9 is an exemplary functional-level schematic of an alternate embodiment of the present invention, the FAST-lean flip-flop, which merges two inputs signals to form a control signal from a slave latch.

Referring now to FIG. 9, therein is shown an alternate mode of the present invention, a FAST lean flip-flop 360 which combines the M2SO and CLK inputs into a single merged control CLK signal 406 for a master latch. A clocked inverter circuit 362 consisting of two series PMOS transistors 364 and 366 is connected to two series NMOS transistors 368 and 370. The source of the PMOS transistor 364 is connected to a power supply $V_{DD}$ 372. The gate of the PMOS transistor 364 is connected to a D input 374. The gate of the PMOS transistor 366 is connected to a system clock, CLK 376. The gate of the NMOS transistor 368 is connected to the inverse of the system clock, ~CLK 378. The gate to the NMOS transistor 370 is connected to the D input 374. The drain of the NMOS transistor 370 is connected to a common ground 380. A node 382 connects the two series transistor circuits and is also connected to the source of an NMOS transistor 384. The gate of the NMOS transistor 384 is connected to a MH input 386. The drain of the NMOS transistor 384 is connected to a node 388.

The node 388 is connected to the inverters that create a master latch 390, which is one of the two latches of the present invention. The master latch 390 is made up of two inverters 392 and 394. The output of the inverter 392 is connected to the input of the inverter 394 and the output of the inverter 394 is connected to the input of the inverter 392. The output of the master latch 390 is connected to the source of an NMOS transistor 396.

The node 388 is also connected to the drain of a different NMOS transistor 398. The gate of the NMOS transistor 398 is connected to a SI2M input 400. The source of the NMOS transistor 398 is connected to the output of an inverter 402. The input of the inverter 402 is connected to an SI input 404.

The gate of the NMOS transistor 396 is connected to the merged input signal represented by the logical AND function (~MH*~CLK) 406. The drain of the NMOS transistor 396 is connected to the components that make up a slave latch 408. The slave latch 408 is made up of two inverters 410 and 412. They are configured so the output of the inverter 410 is connected to the input of the inverter 412 and the output of the inverter 412 is connected to the input of the inverter 410. The output of the master latch 408 is connected to the inputs of inverters 414 and 416. The output of the inverter 414 is a Q signal 418. The output of the inverter 416 is an SO signal 420.

Operation:

In operation, FIG. 1 (Prior Art) shows the basic flip-flop function or "normal mode" of the FAST flip-flop 8. When the CLK 26 is low, it is able to take data from the D input 24 into the master latch 46. When the CLK 26 is high, the data moves into the slave latch 57, and eventually provides the output Q signal 60. The purpose of the MH 28 is to disable the normal D input 24. As the normal D input 24 should be enabled during the "normal mode" of operation, the MH 28 is kept low. During the normal mode of operation, the SI2M 40 and M2SO 68 clocks are both held low so that the scan path is completely disabled. The FAST-lite flip-flop 77 also performs a parallel scan function in a "scan mode". The pulsing of the scan clock SI2M 40 reads in data from the SI port 44 to the master latch 46. The pulsing of the can clock M2SO 68 moves the data from the master latch 46 into the special SO slave latch 70 and eventually provides the SO output 74. The MH input 28 is high during this process, ensuring that the normal data path from the D input 24 is disabled and that the scan path from the SI port 44 is enabled.

The FAST-lite flip-flop 77 of FIG. 2 reduces the area of the flip-flop by sharing the slave latch and eliminates unneeded functionality over the FAST flip-flop 8 of FIG. 1 (PRIOR ART). Although the path remains identical to the "normal mode" of the FAST flip-flop 8, three changes have been made to increase speed and decrease area without changing the test methodology. First, ~MH 102 has been removed from the clocked inverter circuit 11 to being in series with the clocked inverter circuit 78, allowing the master-hold functionality with the use of one transistor instead of four. Second, a bus keeper is used instead of a latch for the slave cell, eliminating a logic stage in the CLK to Q path. Third, the ~Q signal 64 has been removed, further reducing the number of transistors by two for a typical flip-flop.

The implementation of the scan function differs as the SO slave latch 70 has been eliminated, and the slave latch 70 is shared between the normal function and the scan function. The pulsing of the clock SI2M 108 reads in the data from the SI port 112 to the master latch 114. The pulsing of the clock M2SO 138 bypasses the regular system clock CLK 92, allowing the slave latch 128 to be loaded independent of the regular system clock CLK 92. The SO signal 146 is retained separately to facilitate software synthesis.

The operation of the FAST-lite flip-flop 77 of FIG. 2 is depicted by FIG. 3. A static scan test protocol for a chain of three FAST-lite flip-flops (not shown) that would be part of a large system of FAST and FAST-lite flip-flops (not shown). The static scan test is broken up into the serial phase 150 where test data is loaded into storage elements, and the parallel phase 152 where normal-mode operation occurs and results can be observed.

In the serial phase 150, three pulses of the clocks SI2M 162 and M2SO 164 indicate the adding of each of the elements in the scan chain serially with the test values indicated by the SI input 166 of the FAST-lite flip-flop 77. In the subsequent parallel phase 152, the CLK 158 pulses allowing the data to settle in other non-lite flip-flops (not shown) that may be in the design. The primary system inputs 170 become active at this point. The MH 160 then pulses, capturing the effects of the data and allowing the results to be observed. At this time, the primary system outputs 172 can be observed. The term "static scan test" refers to the time between the CLK 158 pulse and the MH 160 pulse the parallel phase 152 being arbitrary. Pulses for the system asynchronous disable 154 and the latch hold 156 occur during the parallel phase 152. Such signals can test both asynchronous logic in a design (not shown) and any unscanned single latch storage elements (not shown).

The Stuck-at-speed Scan Test Protocol of FIG. 4 tests the timing for the FAST-lite flip-flop 77 at the operating frequency for the scan clock on SI2M 188 rather than M2SO 190. In the parallel phase 182, the data is loaded into the flip-flop output on a CLK 184 pule. In order to capture the test results at the operating frequency, there is a second pulse of the CLK 184 that occurs exactly one system clock period later. The MH 186 is low during this period, allowing for the capture of data into the flip-flop at the operating frequency.

FIG. 5 shows the operating signals given three different clocks on the chip: CLK1 214, CLK2 216, and CLK3 218. The roles of the clocks can vary depending on the test. The diagram is split into two main sections, the serial phase 210, and the parallel phase 212. The SI2M 222 and M2SO 224 signals operate identically to FIG. 3 and FIG. 4. CLK1 214 is unused in this timing test and operates by going high at the beginning of the test, and staying high throughout the parallel phase 212. All of the flip-flops clocked by this clock will not update, retaining the value that was scanned into them in the previous period of CLK1 214. The rising edges of the clocks occur commensurate with their operating frequency for the first pulse, and the second pulses are aligned so that all the data is captured simultaneously. The MH signal 220 must be able to transition from high to low in one clock period of the fastest clock that is being tested. The MH signal 220 is shared between clock demands so there is no requirement that each clock domain have its own MH signal. All the flip-flops on the chip can have the same MH signal 220.

FIG. 6 shows an alternative FAST-lite flip-flop 229 with a combination of MH and ~CLK into one signal 236 which controls the master latch 246.

FIG. 7 shows an alternative FAST-lite flip-flop 269 with a scanable latch in which the Q output 296 is output from the master latch 288 instead of the slave latch 302.

FIG. 8 shows an alternative FAST-lite flip-flop 319 which scans into a slave latch. The input 340, MH 342, and CLK 344 connect directly into the slave latch 346, rather than passing first through the master latch 326. The master latch 326 is isolated and controlled only by the SI2M 324.

FIG. 9 shows an alternative flip-flop, the FAST-lean flip-flop 360 which combines the CLK and M2SO inputs into one merged signal 406 which controls the slave latch 408. The new, merged signal 406 functions as the CLK 158 shown in FIG. 3 during the parallel phase 152 when the M2SO input 164 is typically dormant and assumes the functionality of the M2SO input 164, as shown in FIG. 3, during the serial phase 150 when the CLK 158 is typically dormant. Because of this merging, the FAST-lean flip-flop 360 depicted in FIG. 9 reduces area and routing congestion over the FAST-lite flip-flop 77 of FIG. 2 by eliminating a global signal and its associated ports, wiring and circuitry.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An integrated circuit having data, scan in, master-hold, clock, scan-into-master, and master-to-scan-out inputs comprising:
    a first switching circuit connected to the data, master-hold, and clock inputs and having a first switching circuit output;
    a second switching circuit connected to the scan in and scan-into-master inputs and having a second switching circuit output;
    a master latch connected to the first switching circuit and second switching circuit and having a master latch output;
    a third switching circuit connected to the master latch output and the master-to-scan-out input and having a third switching circuit output; and
    a single slave latch connected to the third switching circuit output and having a slave latch output which includes a Q output.

2. The integrated circuit as claimed in claim 1 including:
    a circuit to invert the input from the master-hold input to the first switching circuit.

3. The integrated circuit as claimed in claim 1 including:
    a circuit to invert the input from the clock input to the third switching circuit.

4. The integrated circuit as claimed in claim 1 including:
    a circuit to combine the master-hold and the clock inputs to the first switching circuit.

5. The integrated circuit as claimed in claim 1 including:
    a circuit to combine the clock and a master-to-scan-out inputs to the third switching circuit.

6. The integrated circuit as claimed in claim 1 wherein:
    the slave latch output which includes a scan output.

7. The integrated circuit as claimed in claim 1 wherein:
    the master latch output which includes a Q output.

8. The integrated circuit as claimed in claim 1 wherein:
    the slave latch is connected to the first switching circuit output.

9. The integrated circuit as claimed in claim 1 wherein:
    the master and slave latches are operable in a normal operation and a scan operation mode; and
    the slave latch is capable of operating independently of the master latch in both normal and scan operation modes.

10. An integrated circuit having data, scan in, master-hold, clock, scan-into-master, and master-to-scan-out inputs, comprising:
    a first transistor circuit connected to the data, master-hold, and clock inputs and having a first transistor circuit output;
    a second transistor circuit connected to the scan in and scan-into-master inputs and having a second transistor circuit output;
    a master latch connected to the first and second transistor circuit and having a master latch output;
    a third transistor circuit connected to the master latch output and the master-to-scan-out input and having a third transistor circuit output; and
    a single slave latch connected to the third transistor circuit output and having a slave latch output which includes a Q output.

11. The integrated circuit as claimed in claim 10 including:
    inverters to invert the master-hold and clock inputs and having inverted master-hold and clock outputs;
    and wherein:
        the first transistor circuit includes a series of transistors connected to the data and clock inputs, said first transistor circuit includes a second series of transistors connected to the data input and the inverted clock output, and said first and second series of transistors connected to a transistor connected to the inverted master-hold output and the master latch;
        the second transistor circuit includes a transistor connected to the scan in to master input and to the master latch.

12. The integrated circuit as claimed in claim 10 including:
    an inverter to invert the input from the master-hold input to the first transistor circuit.

13. The integrated circuit as claimed in claim 10 including:
    an inverter to invert the input from the clock input to the third transistor circuit.

14. The integrated circuit as claimed in claim 10 including:
    a logical AND gate to combine the master-hold and the clock inputs to the first transistor circuit.

15. The integrated circuit as claimed in claim 10 including:
    a logical AND gate to combine the master-to-scan-out and clock inputs to the third transistor circuit.

16. The integrated circuit as claimed in claim 10 wherein:
the slave latch output which includes a scan output.

17. The integrated circuit as claimed in claim 10 wherein:
the master latch output which includes a Q output.

18. The integrated circuit as claimed in claim 10 wherein:
the slave latch is connected to the first transistor circuit output.

19. The integrated circuit as claimed in claim 10 wherein:
the master and slave latches are operable in a serial phase and a parallel phase whereby test data is obtained in the serial phase and test data results obtained in the parallel phase.

* * * * *